United States Patent
Yamauchi (10) Patent No.: US 8,872,186 B2
(45) Date of Patent: Oct. 28, 2014

(54) DISPLAY DEVICE AND METHOD FOR MANUFACTURING SAME

(75) Inventor: Tetsuya Yamauchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 37 days.

(21) Appl. No.: 13/989,237

(22) PCT Filed: Nov. 21, 2011

(86) PCT No.: PCT/JP2011/076802
§ 371 (c)(1),
(2), (4) Date: May 23, 2013

(87) PCT Pub. No.: WO2012/070530
PCT Pub. Date: May 31, 2012

(65) Prior Publication Data
US 2013/0234197 A1    Sep. 12, 2013

(30) Foreign Application Priority Data
Nov. 26, 2010 (JP) .................... 2010-263595

(51) Int. Cl.
| H01L 29/786 | (2006.01) |
| H01L 27/12 | (2006.01) |
| G02F 1/1368 | (2006.01) |

(52) U.S. Cl.
CPC .......... *H01L 27/124* (2013.01); *H01L 27/1288* (2013.01); *H01L 27/1244* (2013.01); *H01L 27/1259* (2013.01); *G02F 1/1368* (2013.01)
USPC .............. 257/72; 257/E27.111; 257/E21.414; 438/158

(58) Field of Classification Search
CPC ...................... H01L 27/1214; H01L 29/66765; H01L 29/4908; H01L 27/3244
USPC .............. 257/72, E21.414, E27.111; 438/158
See application file for complete search history.

(56) References Cited

U.S. PATENT DOCUMENTS

| 6,582,982 B2 * | 6/2003 | Jeong et al. ..................... 438/30 |
| 2002/0160555 A1 * | 10/2002 | Hong et al. .................... 438/158 |
| 2003/0107040 A1 * | 6/2003 | Tokuhiro et al. ................ 257/72 |
| 2006/0131581 A1 * | 6/2006 | Kim et al. ....................... 257/59 |
| 2007/0052022 A1 * | 3/2007 | Park et al. ..................... 257/347 |
| 2008/0265442 A1 * | 10/2008 | Yagi ............................. 257/786 |
| 2008/0268581 A1 * | 10/2008 | Chin et al. .................... 438/151 |

FOREIGN PATENT DOCUMENTS

| JP | 2002-190598 A | 7/2002 |
| JP | 2008-277371 A | 11/2008 |

* cited by examiner

*Primary Examiner* — Steven J Fulk
(74) *Attorney, Agent, or Firm* — Chen Yoshimura LLP (57) ABSTRACT

A method for manufacturing a display device provided with gate wiring lines (112) disposed on a substrate to supply signals to TFTs, and a plurality of source wiring lines (111) disposed above the gate wiring lines, the method for manufacturing a display device including: a step of forming a first conductive pattern (31) that includes the gate wiring lines (112) by etching a gate metal layer with a first resist pattern as a mask; and a step of forming a second resist pattern (12) at a portion located between the source wirings (111) so as to expose a portion of an edge of an upper surface of the first conductive pattern (31) and so as to cover other parts thereof, at the aforementioned portion of the edge of the upper surface, the first conductive pattern (31) is etched off from the upper surface through an intermediate point along the direction of thickness.

4 Claims, 14 Drawing Sheets

DISPLAY DEVICE AND METHOD FOR MANUFACTURING SAME

TECHNICAL FIELD

The present invention relates to a display device and a method of manufacturing the same.

BACKGROUND ART

A liquid crystal display device is a type of a display device. A liquid crystal display device in which a plurality of pixel electrodes are driven by thin film transistors, respectively, is known. Such a configuration is called an active matrix type. This liquid crystal display device includes gate wiring lines disposed on a substrate for supplying signals to thin film transistors, and a plurality of source wiring lines formed above the gate wiring lines so as to intersect with the gate wiring lines.

Japanese Patent Application Laid-Open Publication No. 2008-277371 (Patent Document 1) discloses an example of the invention for preventing disconnections of the electrode material in forming thin film transistors in a display device of the active matrix type.

RELATED ART DOCUMENT

Patent Document

Patent Document 1 Japanese Patent Application Laid-Open Publication No. 2008-277371

SUMMARY OF THE INVENTION

Problems to be Solved by the Invention

Conductive patterns such as gate wiring lines and gate electrodes are formed by depositing a metal layer called a gate metal layer first, and by thereafter patterning the metal layer into a desired shape. Side faces of these conductive patterns are typically inclined.

As the resolution of the liquid crystal display device is made higher, the design widths of gate wiring lines, gate electrodes, and the like become smaller. When the width of the conductive pattern to be formed by patterning the gate metal layer is smaller than a certain width, the side faces of the conductive pattern are vertically inclined.

On the other hand, source wiring lines are formed by depositing a metal layer called a source metal layer first, and by thereafter patterning the metal layer into a desired shape.

In a display device in which gate wiring lines, gate electrodes, and the like are disposed with a small gap therebetween so as to address a need for higher resolution, a leak current is sometimes caused between source wiring lines.

The present invention aims at providing a display device that can reduce an occurrence of a leak current between source wiring lines, and a method of manufacturing the same.

Means for Solving the Problems

In order to achieve the above-mentioned object, the present invention provides a method of manufacturing a display device in which a plurality of pixel electrodes are driven by thin film transistors, respectively, the display device including gate wiring lines disposed on a substrate to supply signals to the thin film transistors and a plurality of source wiring lines disposed above the gate wiring lines so as to intersect with the gate wiring lines, the method including: forming a gate metal layer on a surface of the substrate; forming a first resist pattern so as to cover a portion of an upper surface of the gate metal layer; etching the gate metal layer by using the first resist pattern as a mask to form a first conductive pattern that includes the gate wiring lines; and forming a second resist pattern partially exposing a portion of an edge of an upper surface of the first conductive pattern between the source wiring lines to be formed and covering other portions of the first conductive pattern, and etching the partially exposed portion of the edge of the upper surface of the first conductive pattern through an intermediate point of the first conductive pattern along a direction of thickness.

Effects of the Invention

Conventionally, grooves were likely to be formed at level different portions of an interlayer insulating film located above the edges of the first conductive pattern. However, with the present invention, such grooves are less likely to be formed, and therefore, it is possible to prevent a part of the source metal layer from being left after a removal process. This makes it possible to reduce an occurrence of a leak current between the source wiring lines.

DETAILED DESCRIPTION OF EMBODIMENTS

The inventor of the present invention and colleagues have conducted a study to find out a cause of a leak current between source wiring lines. As a result, it was discovered that a recess was formed at a level different portion of an interlayer insulating film disposed above a layer that is formed of the gate metal layer such as gate wiring lines, and when forming and etching the source metal layer, the source metal was left in this recess and not completely removed. This caused the source wiring lines to be electrically connected to each other, which was the main cause of the leak current.

The inventor of the present invention and colleagues also conducted a study to find out a cause of the recess formed at the level different portion of the interlayer insulating film. As a result, it was discovered that abnormal growth of the interlayer insulating film occurred in a localized area, and in this area, the etching rate was increased. Furthermore, it was discovered that the abnormal growth of the interlayer insulating film was caused by the side face of the conductive pattern formed of the gate metal layer being vertically inclined.

Figure 1:
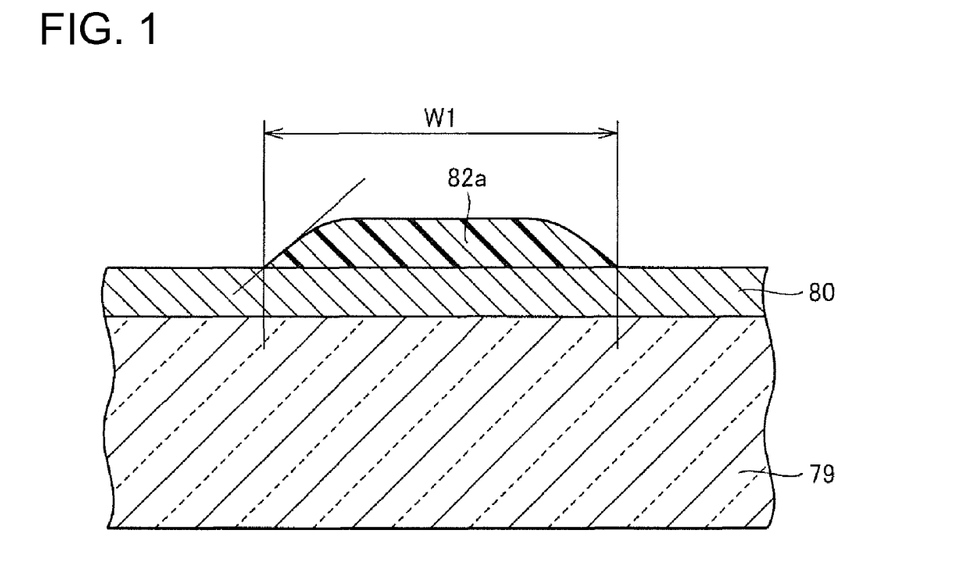
FIG. 1 is a first diagram for illustrating a case in which the width of a conductive pattern to be formed of a gate metal layer is large.
Figure 2:
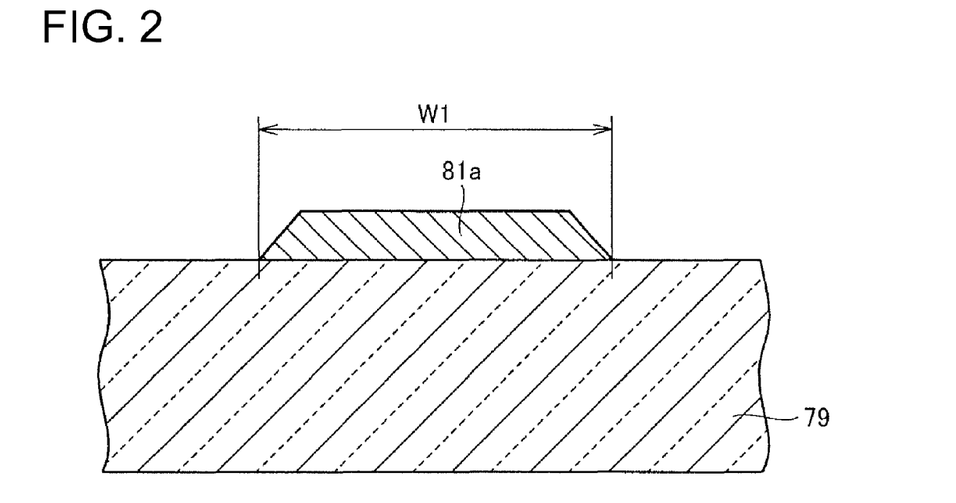
FIG. 2 is a second diagram for illustrating a case in which the width of a conductive pattern to be formed of a gate metal layer is large.
Figure 3:
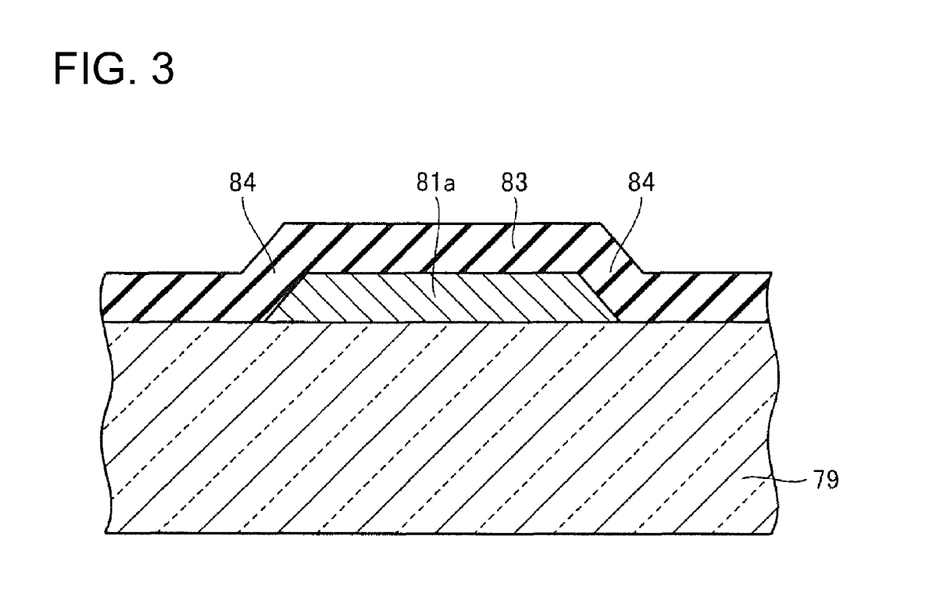
FIG. 3 is a cross-sectional view of a state after an interlayer insulating film is formed when the width of a conductive pattern to be formed of a gate metal layer is large.

Below, specific structures will be explained with reference to figures. As shown in FIG. 1, for example, when the width W1 of a conductive pattern to be made of a gate metal layer 80 on a substrate 79 is sufficiently large, edges of a resist pattern 82a are inclined at a small angle in a cross-sectional view. FIG. 1 shows an auxiliary line to make the incline at an edge of the resist pattern 82a easier to see. A conductive pattern obtained by etching the gate metal layer 80 by using the resist pattern 82a as a mask has a cross-sectional shape shown in FIG. 2. FIG. 3 shows a state in which an interlayer insulating film has been formed on the conductive pattern 81a. Portions 84 that correspond to the side walls of the interlayer insulating film 83 grow in a different manner from other portions, but the difference is not large enough to cause a significant problem.

Figure 4:
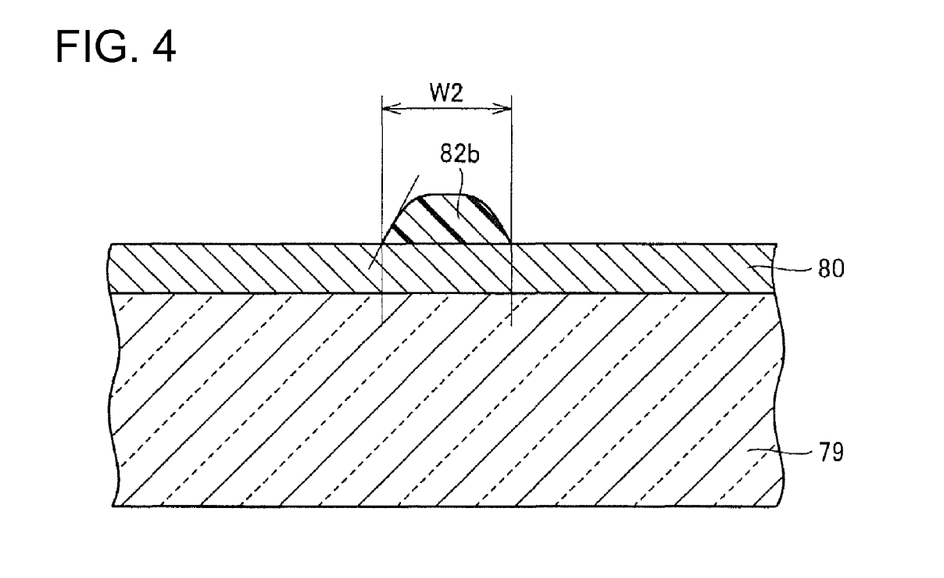
FIG. 4 is a first diagram for illustrating a case in which the width of a conductive pattern to be formed of a gate metal layer is small.
Figure 5:
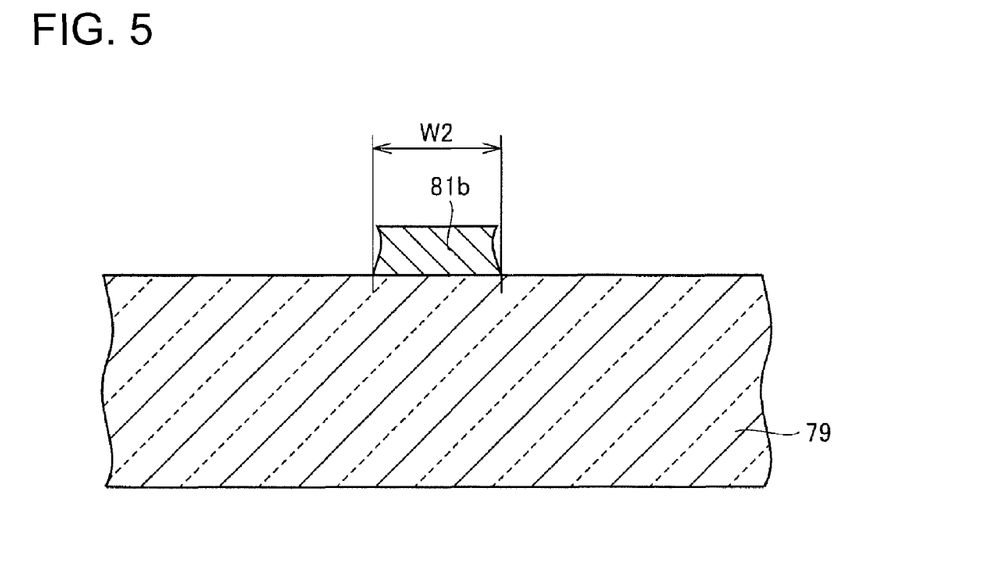
FIG. 5 is a second diagram for illustrating a case in which the width of a conductive pattern to be formed of a gate metal layer is small.
Figure 6:
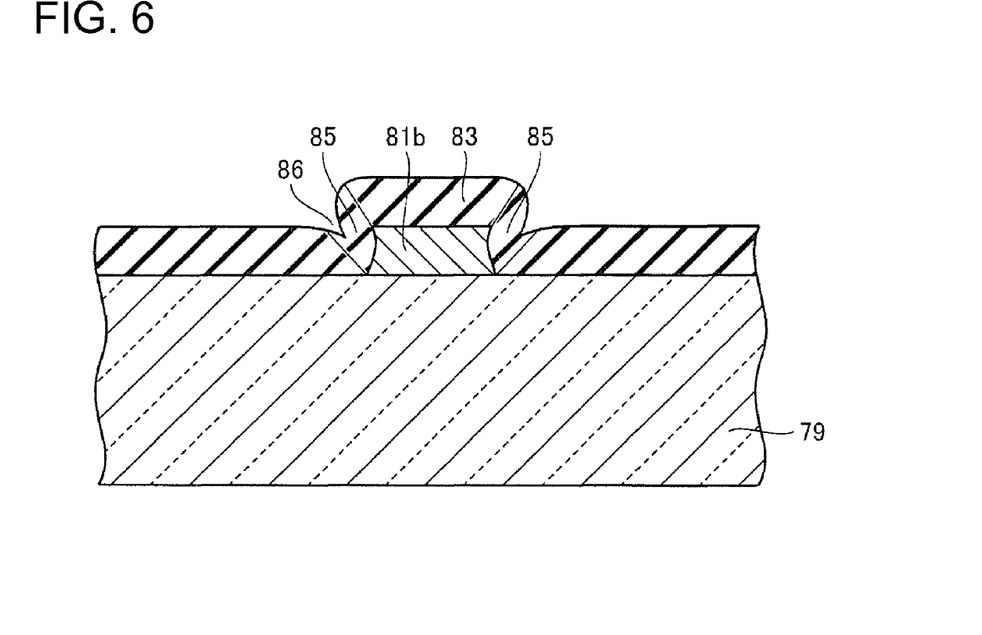
FIG. 6 is a cross-sectional view of a state after an interlayer insulating film is formed when the width of a conductive pattern to be formed of a gate metal layer is small.

In contrast, as shown in FIG. 4, when the width W2 of the conductive pattern to be made of the gate metal layer is small, edges of the resist pattern 82b is inclined at a large angle. FIG. 4 shows an auxiliary line to make the incline at an edge of the resist pattern 82b easier to see. The auxiliary line in FIG. 4 has a higher gradient than the auxiliary line in FIG. 1. A conductive pattern obtained by etching the gate metal layer 80 by using the resist pattern 82b as a mask has a cross-sectional shape shown in FIG. 5. That is, the side faces of the conductive pattern 81b become vertical. FIG. 6 shows a state in which an interlayer insulating film has been formed on the conductive pattern 81b. Abnormal growth occurs in portions 85 that correspond to the side walls of the interlayer insulating film 83, and the etching rate is increased therein. Thus, the portions 85 are more likely to be removed by pre-wash conducted in forming a source metal layer, causing a groove 86 to be formed. The groove 86 is extended in a direction that is perpendicular to a plane parallel to the sheet of paper. After forming the interlayer insulating film, a conductive film having a three-layer structure of Ti—Al—Ti as the source metal layer is formed and patterned. The inventor of the present invention and colleagues have discovered that, in a process of removing the source metal layer, a portion of the conductive film sometimes remains inside of the groove 86 and cannot be completely removed in a position where the groove 86 is formed. In addition, the inventor of the present invention and colleagues have discovered that the remaining conductive film inside of the groove 86 causes a leak current between source wiring lines.

Furthermore, as the width of the conductive pattern made of the gate metal layer has been made smaller, a distance between the source wiring lines has also been made smaller, and due to the shorter distance, the risk of the leak current has been increased.

The inventor of the present invention and colleagues have arrived at the present invention based on the above-mentioned findings.

Embodiment 1

Figure 7:
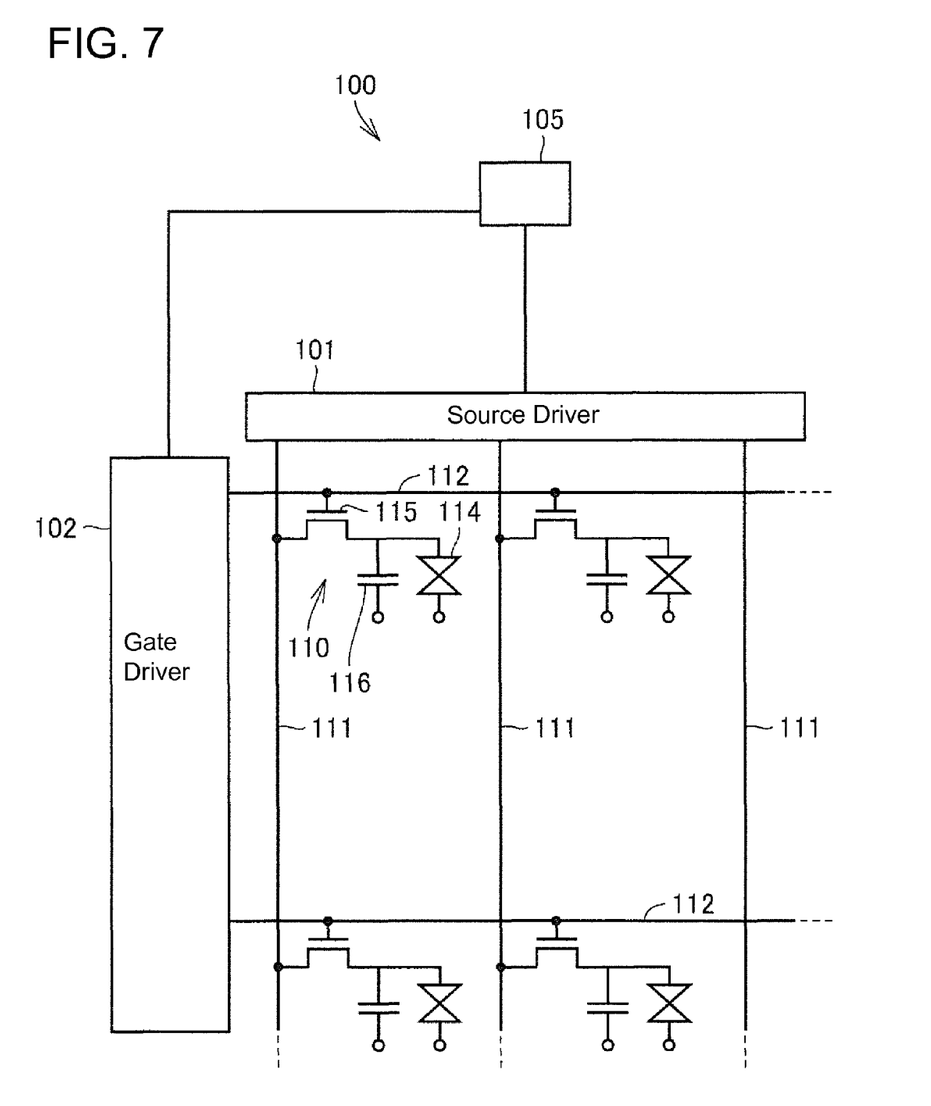
FIG. 7 is a schematic view of a display device obtained through a method of manufacturing a display device according to Embodiment 1 of the present invention.

A method of manufacturing a display device of Embodiment 1 of the present invention will be explained with reference to FIGS. 7 to 18. FIG. 7 is a schematic diagram showing a display device obtained by the manufacturing method. A display device 100 includes a source driver 101 and a gate driver 102. The source driver 101 and the gate driver 102 are connected to a controller 105, and receive signals from the controller 105. A plurality of source wiring lines 111 are extended in parallel with each other from the source driver 101. A plurality of gate wiring lines 112 are extended in parallel with each other from the gate driver 102. TFTs 115 are provided near respective intersections of the source wiring lines 111 and the gate wiring lines 112, and each of the TFTs 115 is connected to a pixel electrode 114 and an auxiliary capacitance electrode 116. A region enclosed by two source wiring lines 111 and two gate wiring lines 112 corresponds to one pixel 110. Each pixel 110 includes a TFT 115, a pixel electrode 114, and an auxiliary capacitance electrode 116. FIG. 7 shows a small number of pixels 110, but in the actual display region of the display device 100, a larger number of pixels 110 are arranged.

Figure 8:
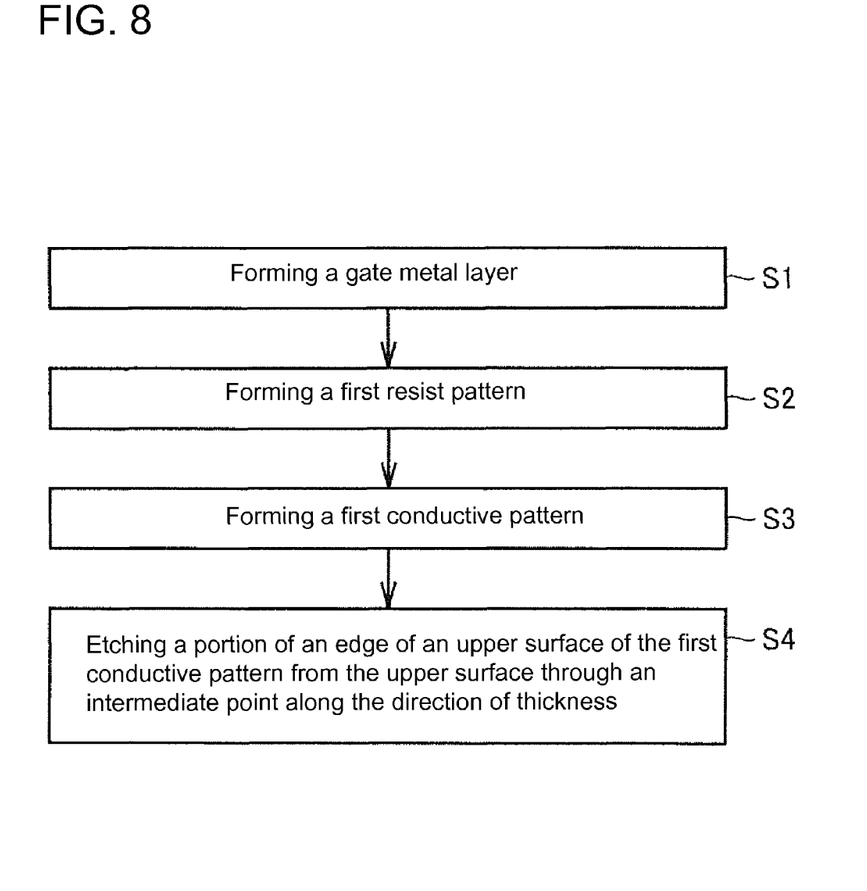
FIG. 8 is a flowchart of the method of manufacturing a display device of Embodiment 1 of the present invention.

FIG. 8 shows a flowchart of the method of manufacturing a display device of the present embodiment. The display device to be manufactured by the method of manufacturing a display device of the present embodiment is a display device in which a plurality of pixel electrodes are driven by thin film transistors, respectively, and the display device includes gate wiring lines disposed on a substrate to supply signals to the thin film transistors and a plurality of source wiring lines disposed above the gate wiring lines so as to intersect with the gate wiring lines. The method of manufacturing a display device of the present embodiment includes steps S1 to S4. In the step S1, a gate metal layer is formed on a surface of the substrate. In the step S2, a first resist pattern is formed so as to cover a portion of an upper surface of the gate metal layer. In the step S3, a first conductive pattern that includes the gate wiring lines is formed by etching the gate metal layer using the first resist pattern as a mask. In the step S4, a second resist pattern is formed in a portion of the first conductive pattern located between the source wiring lines so as to partially expose a portion of an edge of an upper surface of the first conductive pattern and so as to cover other portions, and the first conductive pattern is etched to remove the portion of the edge of the upper surface from the upper surface through an intermediate point along the direction of thickness. Below, the respective steps will be explained in detail.

Figure 9:
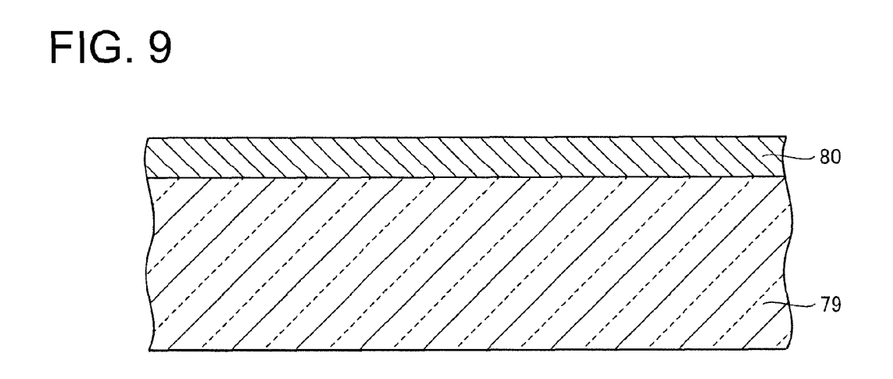
FIG. 9 is a diagram illustrating a first process in the method of manufacturing a display device of Embodiment 1 of the present invention.

First, in the step S1, as shown in FIG. 9, a gate metal layer 80 is formed on the entire upper surface of a substrate 79. Other layers may be disposed between the substrate 79 and the gate metal layer 80, but in this example, for ease of explanation, layers between the substrate 79 and the gate metal layer 80 are not shown. The same is true for other cross-sectional views. Also, the same is true for FIGS. 1 to 6 described above.

Figure 10:
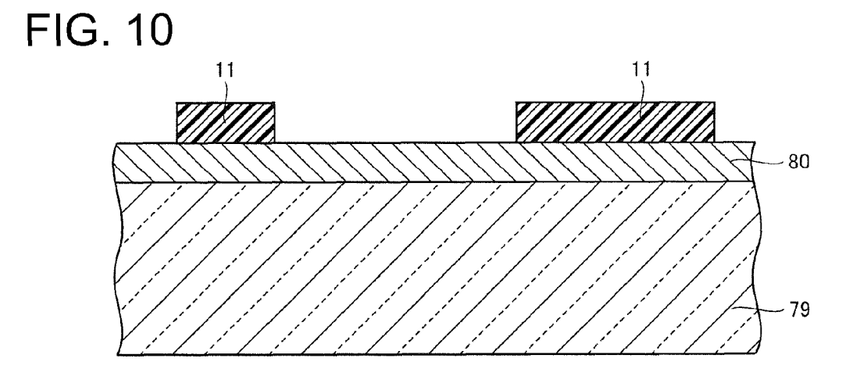
FIG. 10 is a diagram illustrating a second process in the method of manufacturing a display device of Embodiment 1 of the present invention.

In the step S2, as shown in FIG. 10, a first resist pattern 11 is formed so as to cover portions of the upper surface of the gate metal layer 80.

Figure 11:
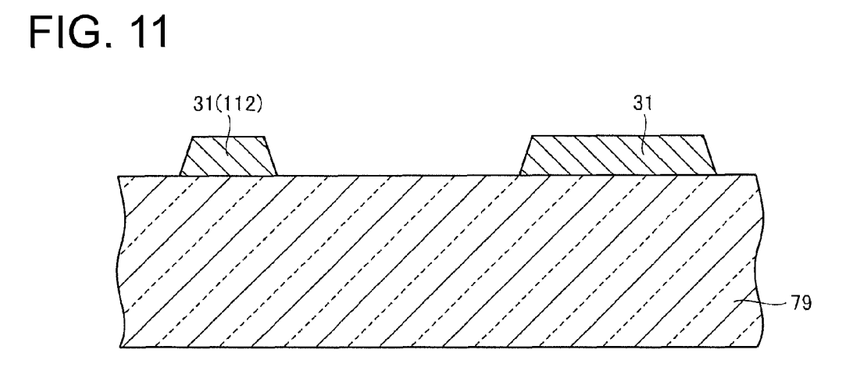
FIG. 11 is a diagram illustrating a third process in the method of manufacturing a display device of Embodiment 1 of the present invention.
Figure 12:
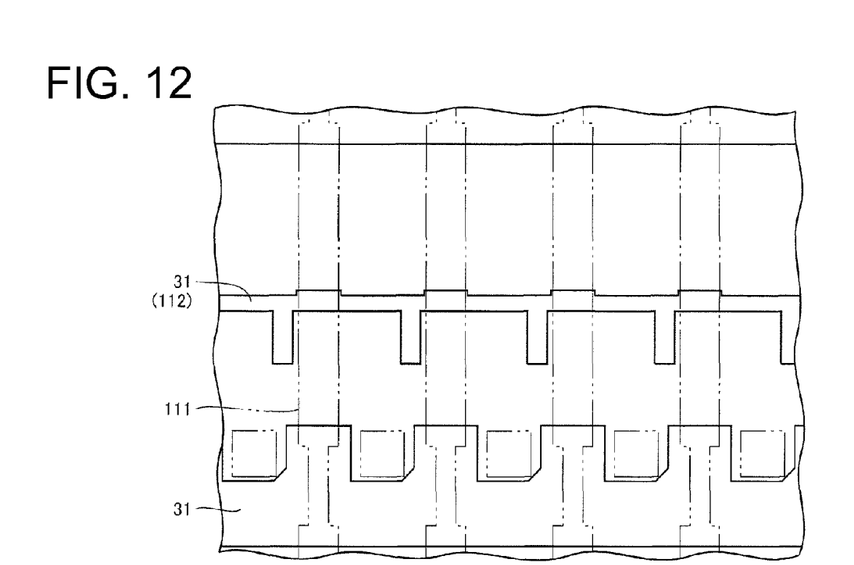
FIG. 12 is a plan view of a state after the third process is completed in the method of manufacturing a display device of Embodiment 1 of the present invention.

In the step S3, as shown in FIG. 11, the gate metal layer 80 is etched by using the first resist pattern 11 as a mask, thereby forming a first conductive pattern 31 that includes a gate wiring line 112. The first conductive pattern 31 may also include a plurality of types of patterns. At least a portion of the first conductive pattern 31 is used as the gate wiring line 112. FIG. 12 is a plan view showing a state after the step S3. A portion of the first conductive pattern 31 forms the gate wiring line 112. The two-dot chain lines in FIG. 12 indicate regions where the source wiring lines 111 are to be formed.

Figure 13:
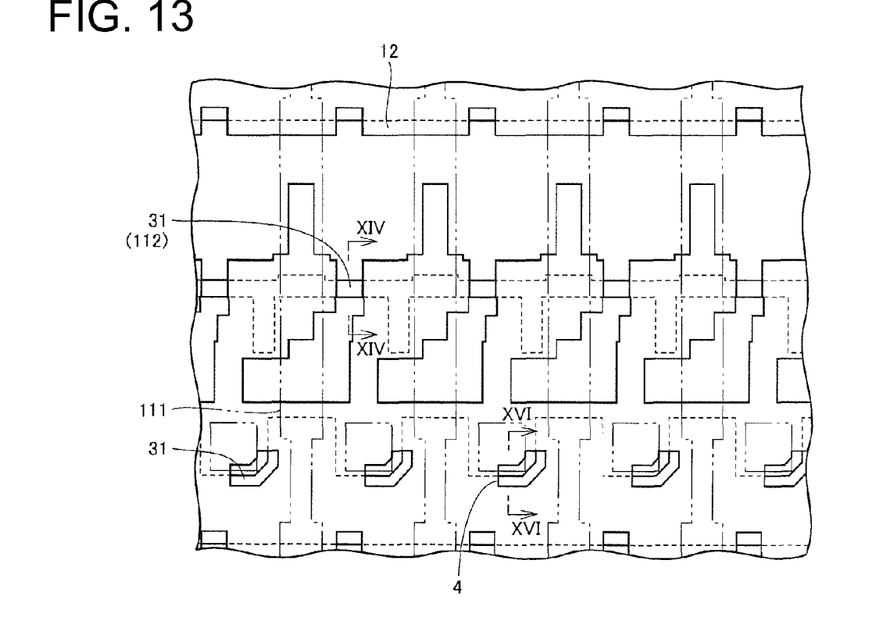
FIG. 13 is a plan view of a state after a second resist pattern is formed to conduct a fourth process in the method of manufacturing a display device of Embodiment 1 of the present invention.

In the step S4, a second resist pattern 12 is formed in regions of the first conductive pattern 31 located between the respective source wiring lines 111 so as to expose portions of edges of an upper surface of the first conductive pattern 31 and so as to cover other portions (see FIG. 13). Thereafter, etching is performed to remove the portions of the edges of the upper surface of the first conductive pattern 31 from the upper surface through an intermediate point along the direction of thickness. In FIG. 13, a plurality of openings of the second resist pattern 12 are shown, and the first conductive pattern 31 are seen through the openings. In regions other than the openings, the first conductive pattern 31 is covered by the second resist pattern 12.

In a conventional configuration, between the step of forming the gate metal layer and the step of forming an interlayer insulating film, "PD doping" is typically conducted. In the "PD doping," a P-type impurity such as boron is injected by using a prescribed pattern as a mask. The second resist pattern 12 used in the step S4 can be obtained by modifying the mask pattern used in the PD doping. Etching on the portions of the first conductive pattern 31 in the step S4 can be conducted by using $CF_4$ gas before the resist ashing that is to be conducted after the PD doping. The "resist ashing" is an ashing process conducted to remove the second resist pattern 12.

Figure 14:
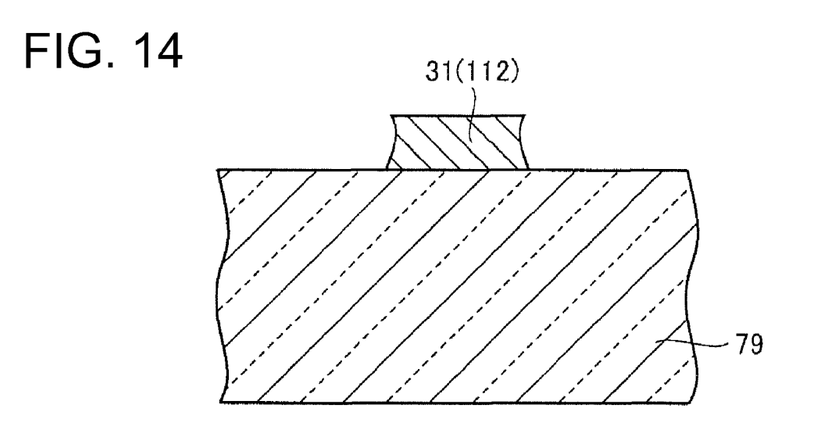
FIG. 14 is a cross-sectional view along the arrow XIV-XIV of FIG. 13.
Figure 15:
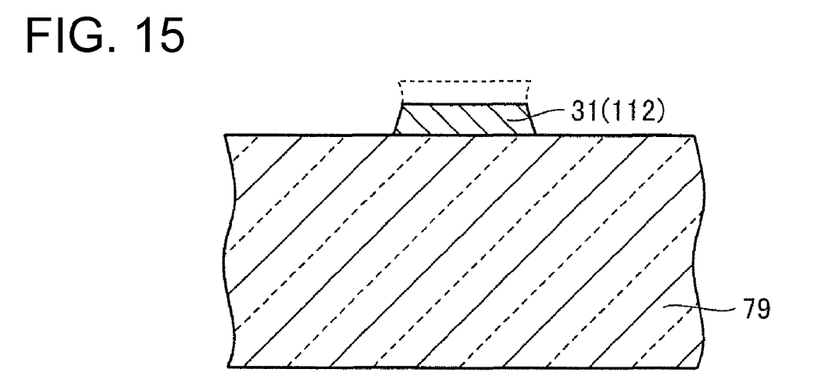
FIG. 15 is a cross-sectional view showing a first conductive pattern of FIG. 14, part of which has been removed.

FIG. 14 is a cross-sectional view along the arrow XIV-XIV in FIG. 13. FIG. 14 shows a state before the etching in the step S4 is started. In this portion, the first conductive pattern 31, which is the gate wiring line 112, is extended in a direction perpendicular to a plane that is parallel to the surface of the sheet of paper. Therefore, in FIG. 14, the length of the first conductive pattern 31 in the horizontal direction corresponds to the width of the gate wiring line 112. The upper part of the first conductive pattern 31 is not covered by the second resist pattern 12. That is, in this part, the gate wiring line 112 is exposed from the second resist pattern 12 over the entire width thereof. Each side face of the first conductive pattern 31 has an overhang. Through etching, as shown in FIG. 15, a portion of the first conductive pattern 31 from the upper surface through an intermediate point along the direction of thickness is removed. As a result, at least in this part, the overhang of the side face of the first conductive pattern 31 is removed.

Figure 16:
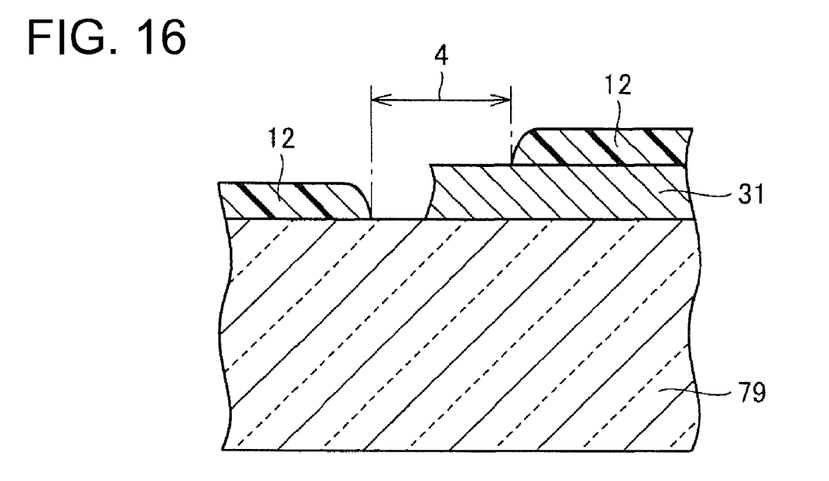
FIG. 16 is a cross-sectional view along the arrow XVI-XVI of FIG. 13.
Figure 17:
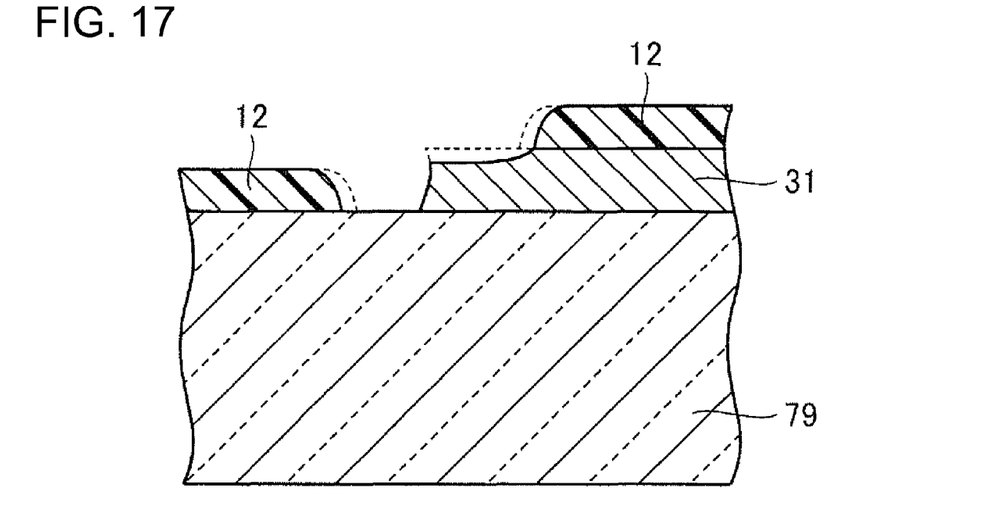
FIG. 17 is a cross-sectional view showing a first state in which a part of a first conductive pattern of FIG. 16 has been removed.
Figure 18:
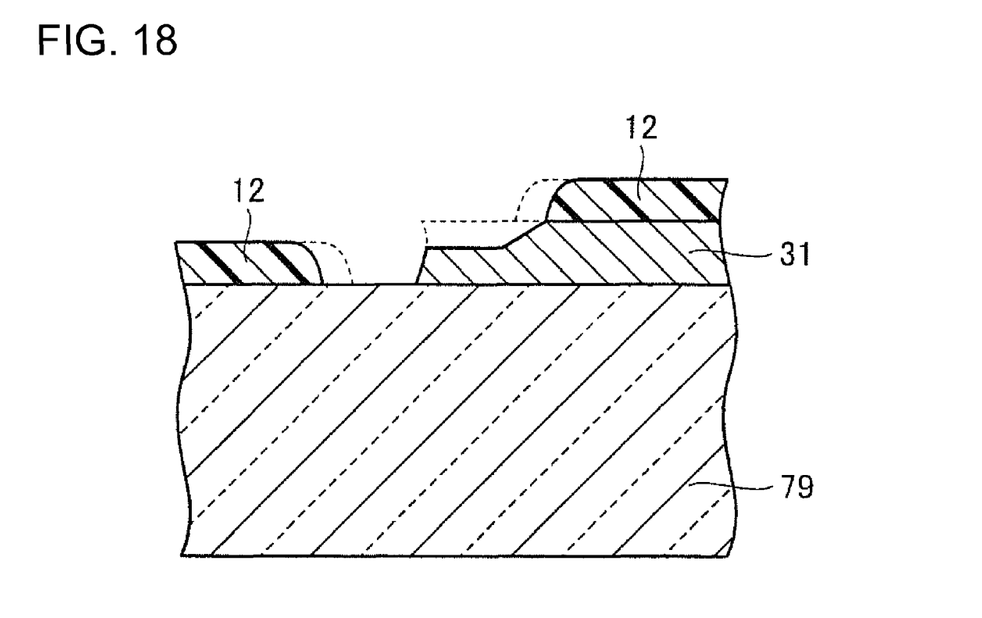
FIG. 18 is a cross-sectional view showing a second state in which a part of the first conductive pattern of FIG. 16 has been removed.

FIG. 16 is a cross-sectional view along the arrow XVI-XVI of FIG. 13. FIG. 16 shows a state before the etching is started. In this portion, the second resist pattern 12 has an opening 4. An edge of the upper surface of the first conductive pattern 31 is exposed through the opening 4. Therefore, a portion of the upper surface of the first conductive pattern 31 is exposed from the second resist pattern 12. Each side face of the first conductive pattern 31 has an overhang. At the start of the etching, as shown in FIG. 17, the second resist pattern 12 slightly recedes. By continuing the etching, as shown in FIG. 18, in the exposed part of the first conductive pattern 31, a portion thereof from the upper surface through an intermediate point along the direction of thickness is removed. As a result, the overhang at the side face of the first conductive pattern 31 is removed. Thereafter, the second resist pattern 12 is removed.

Figure 19:
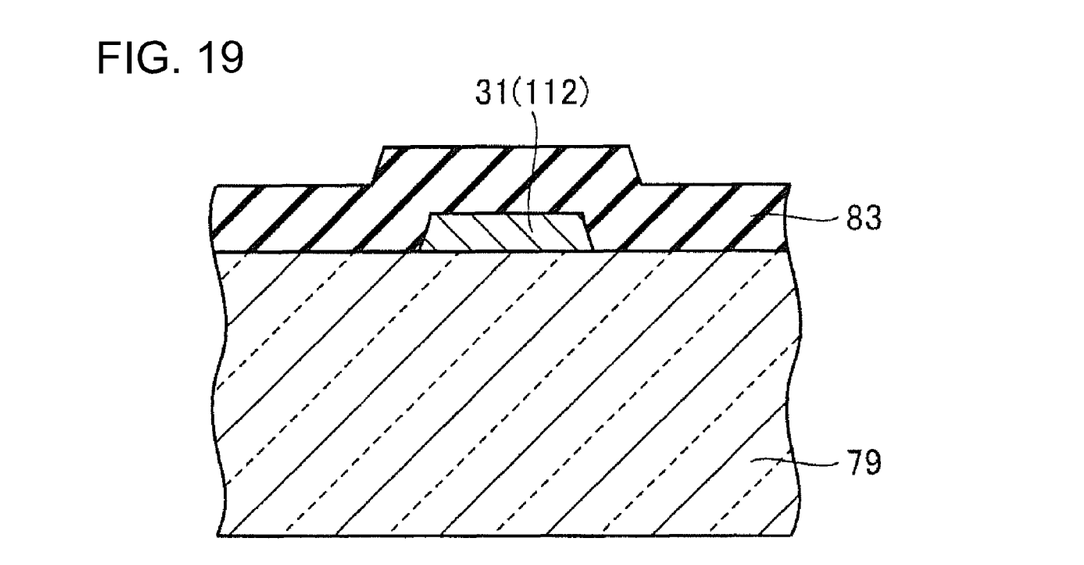
FIG. 19 is a cross-sectional view showing a state in which an interlayer insulating film has been formed so as to cover the portion indicated in FIG. 15.
Figure 20:
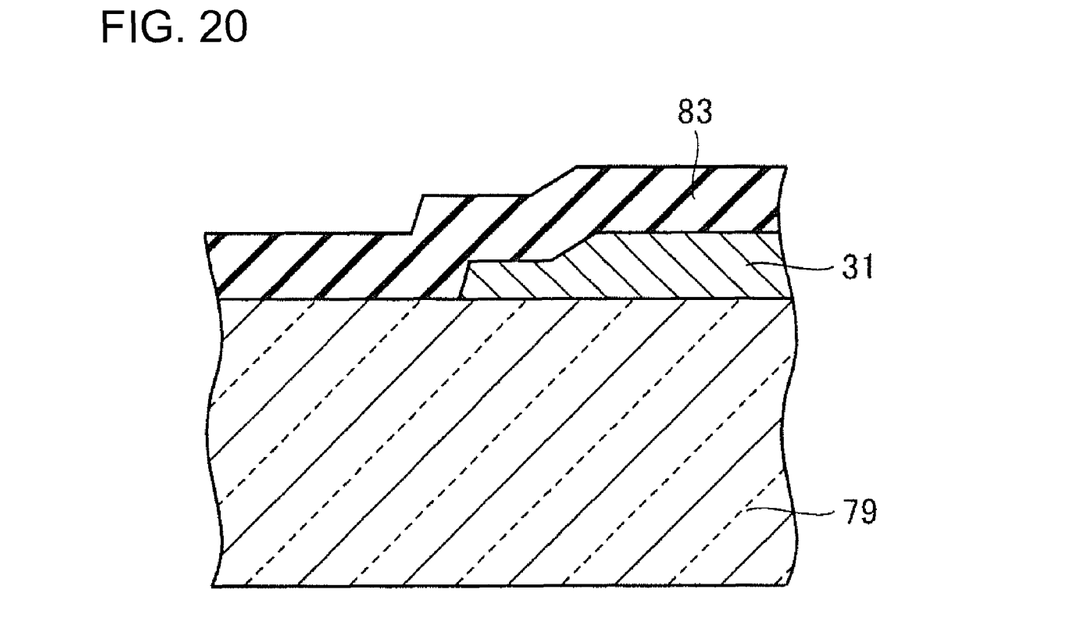
FIG. 20 is a cross-sectional view showing a state in which an interlayer insulating film has been formed so as to cover the portion indicated in FIG. 18.

In the method of manufacturing the display device of the present embodiment, the overhang at the side face of the first conductive pattern 31 is removed in the step S4. Therefore, when the interlayer insulating film 83 is formed after removing the second resist pattern 12, abnormal growth does not occur, making it possible to form, in a desired manner, the interlayer insulating film 83 that has no groove. For example, in the portion shown in FIG. 15, the state shown in FIG. 19 is achieved. In the portion shown in FIG. 18, the interlayer insulating film 83 is formed as shown in FIG. 20.

In the method of manufacturing the display device of the present embodiment, the groove shown in FIG. 6 is not formed at a level different portion of the interlayer insulating film, and therefore, it is possible to prevent a portion of the source metal layer from being left instead of being removed. This makes it possible to reduce an occurrence of a leak current between the source wiring lines.

It is preferable to form the second resist pattern 12 by modifying the mask pattern used for PD doping. In this way, the present invention can be implemented without increasing the number of photolithography processes as compared with the conventional configuration. This can be summarized as follows. It is preferable that the method of manufacturing a display device of the present invention include, after the step of etching off a portion of the first conductive pattern from the upper surface thereof through an intermediate point along the direction of thickness, a step of doping an impurity through an impurity doping mask, and that the second resist pattern, which is used in the step of etching off a portion of the first conductive pattern from the upper surface thereof through an intermediate point along the direction of thickness, be formed by using the impurity doping mask.

Figure 21:
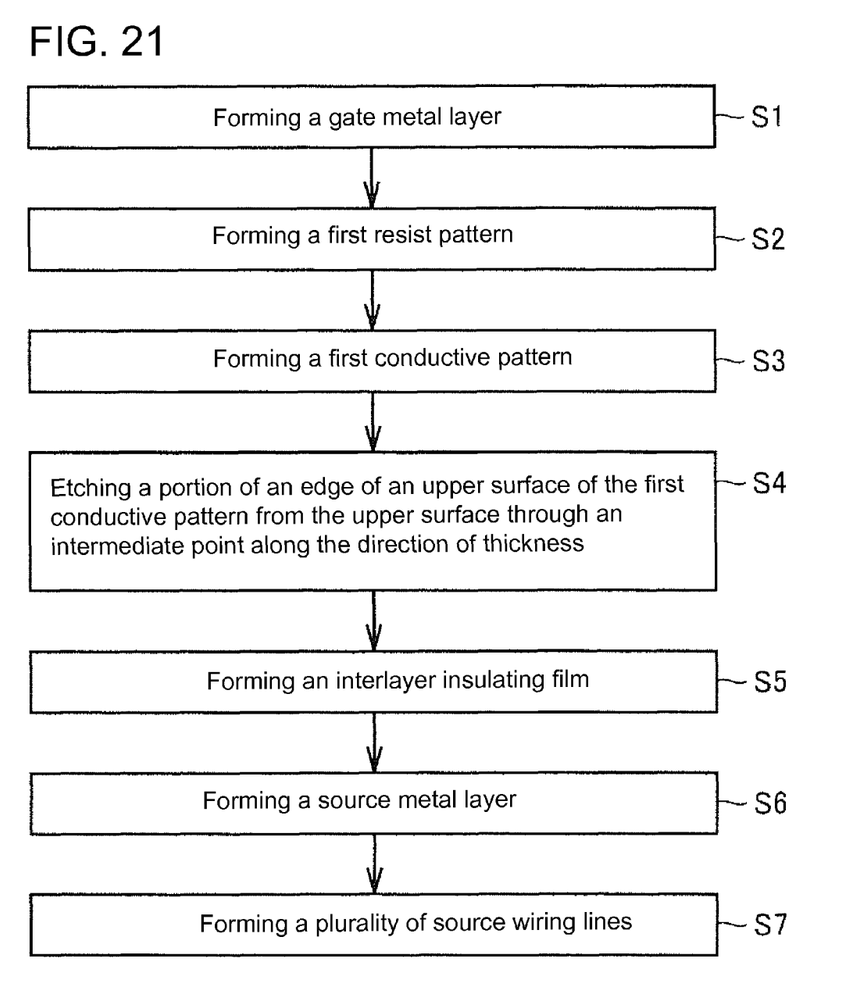
FIG. 21 is a flowchart of a preferred example of the method of manufacturing a display device of Embodiment 1 of the present invention.
Figure 22:
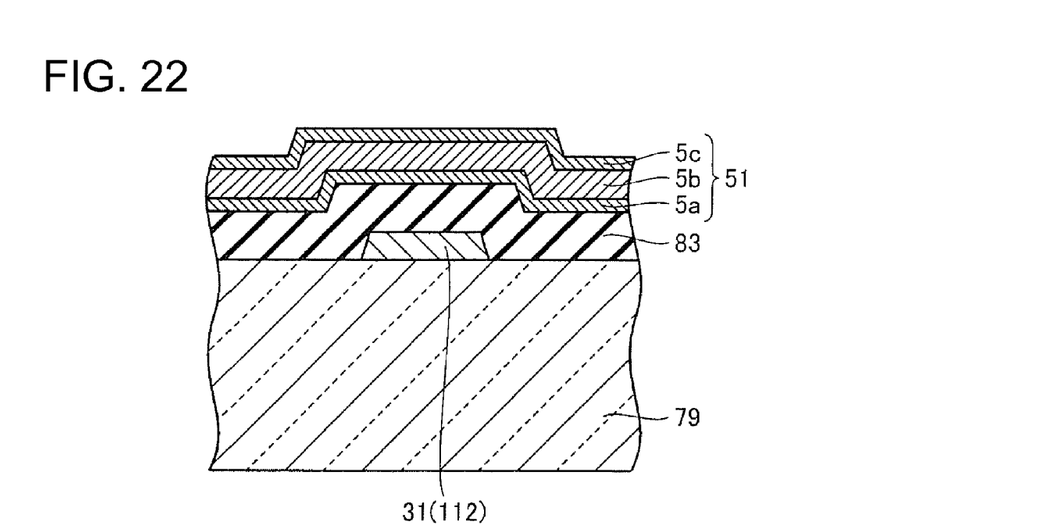
FIG. 22 is a cross-sectional view along the arrow XIV-XIV of FIG. 13 in a state in which a step of forming a source metal layer has been completed in the method of manufacturing a display device of Embodiment 1 of the present invention.
Figure 23:
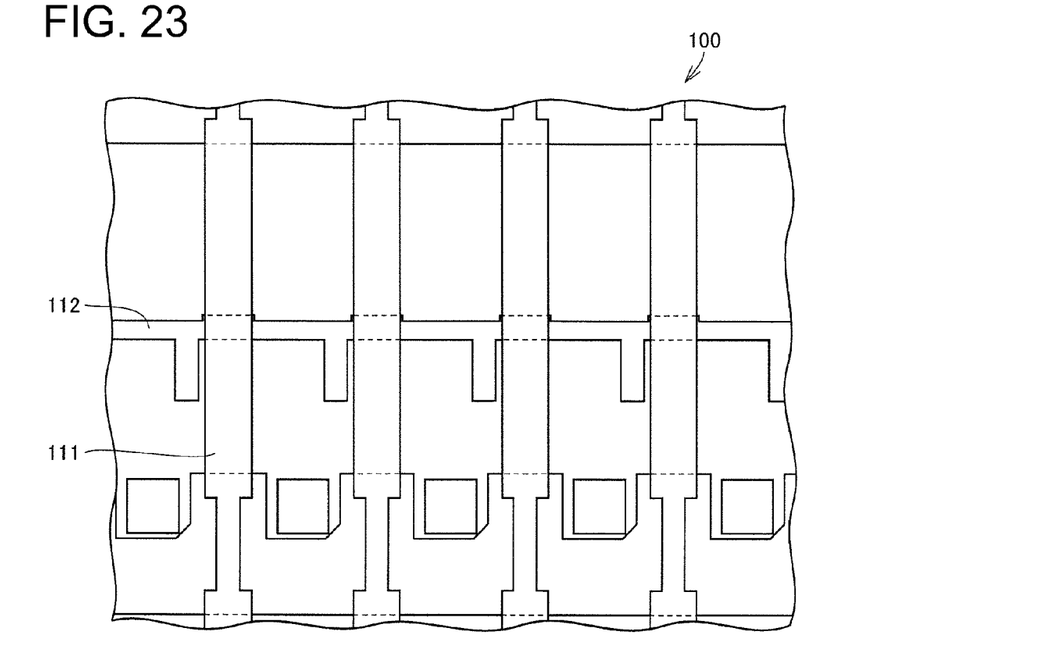
FIG. 23 is a plan view showing a state in which a step of forming a plurality of source wiring lines has been completed in the method of manufacturing a display device of Embodiment 1 of the present invention.

As shown in FIG. 21, it is preferable that the method of manufacturing a display device of the present embodiment further include a step S5 of forming the interlayer insulating film 83 so as to cover the first conductive pattern 31, a step S6 of forming the source metal layer 51 so as to cover the interlayer insulating film 83 (see FIG. 22), and a step S7 of forming a plurality of source wiring lines 111 by patterning the source metal layer 51 (see FIG. 23). With this configuration, it is possible to reduce an occurrence of a leak current between source wiring lines in a device that is provided with source wiring lines. FIG. 21 does not show the PD doping process. FIG. 22 is a cross-sectional view along the arrow XIV-XIV of FIG. 13 after the step S6 is completed. FIG. 19 shows a state after the step S7 is completed. The same state is shown in the plan view in FIG. 23. A step of forming a semiconductor film, a step of patterning the semiconductor film, a step of forming an insulating film, a step of doping an impurity, and the like may be performed before the step S1. Alternatively, the step of forming a semiconductor film, the step of patterning the semiconductor film, the step of doping an impurity, and the like may be performed between the step S4 and the step S6. For ease of explanation, the semiconductor film is not shown in FIG. 23.

The source metal layer has a three-layer structure formed by laminating Ti, Al, and Ti in this order, for example. That is, as shown in FIG. 22, a Ti layer 5a, an Al layer 5b, and a Ti layer 5c are layered in this order from the bottom side. In this case, by adopting the method of manufacturing a display device of the present embodiment, it is possible to prevent the Ti layer 5a from being left in an unintended manner. The source metal layer may also have a three-layer structure of Mo, Al, and Mo, instead of the three-layer structure of Ti, Al, and Ti. Alternatively, the source metal layer may be formed of other materials than the materials above. The source metal layer does not need to have a three-layer structure. The source metal layer may have a single-layer structure, or a multilayer structure having more or less than three layers.

Figure 24:
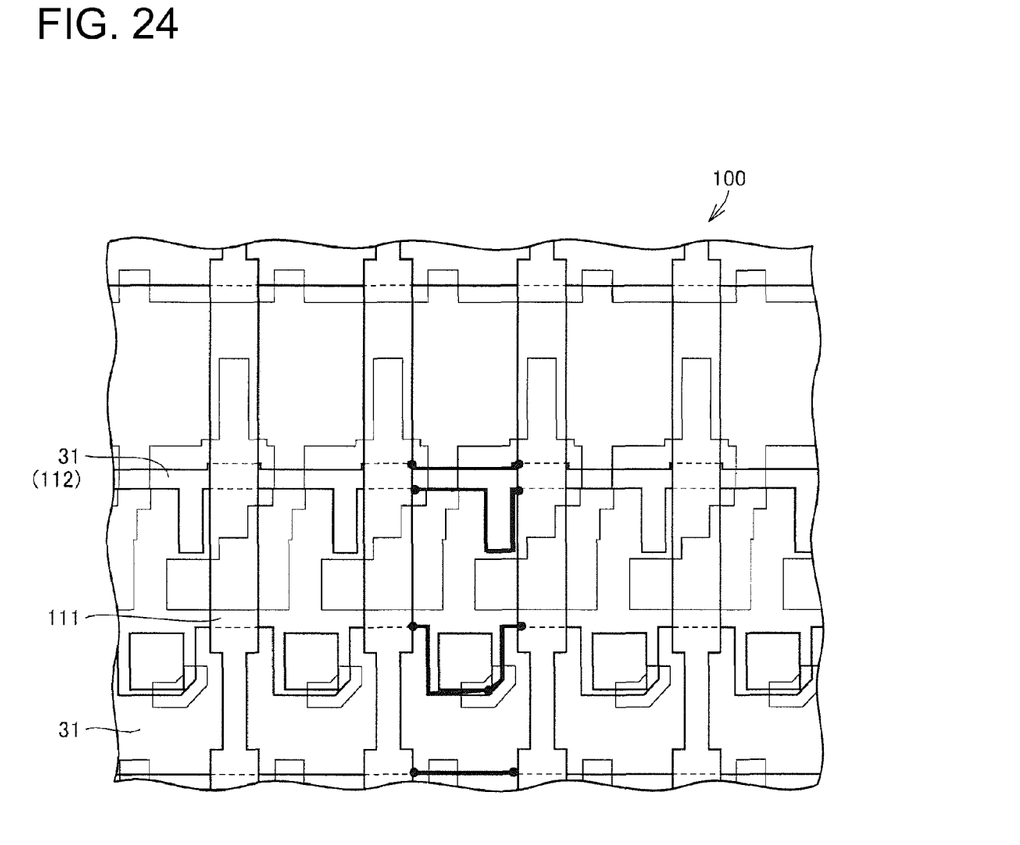
FIG. 24 is the plan view of FIG. 23 in which thick lines were added to show routes of leak currents that would occur between source wiring lines in a conventional configuration, and thin lines were added to show a second resist pattern.

The effect of the present embodiment will be described in detail with reference to FIG. 24. FIG. 24 is the plan view shown in FIG. 23 with several lines added thereto. In FIG. 24, an outline of the second resist pattern is indicated with a narrow line. FIG. 24 indicates several routes with thick lines. The plurality of routes indicated by the thick lines in FIG. 24 are routes where leak currents would occur between the source wiring lines in a conventional configuration. However, with the present invention, in an intermediate point of each route, the second resist pattern had an opening, and in the opening, a portion of the first conductive pattern 31 was removed from the upper surface through an intermediate point thereof along the direction of thickness in the step S4. In such an area, the first conductive pattern 31 does not have an overhang. In other words, in such an area, a groove is not formed at a level difference portion of the interlayer insulating film, and therefore, it is possible to prevent the source metal layer from being left in an unintended manner. Even if grooves are formed at level different portions of the interlayer insulating film in other locations, and the material of the source metal layer is left therein, and even if the remaining portions of the source metal are continued, the remaining source metal is reliably discontinued in the locations where the openings of the second resist pattern were formed in the step S4. This makes it possible to reduce an occurrence of leak currents between source wiring lines.

Embodiment 2

Figure 25:
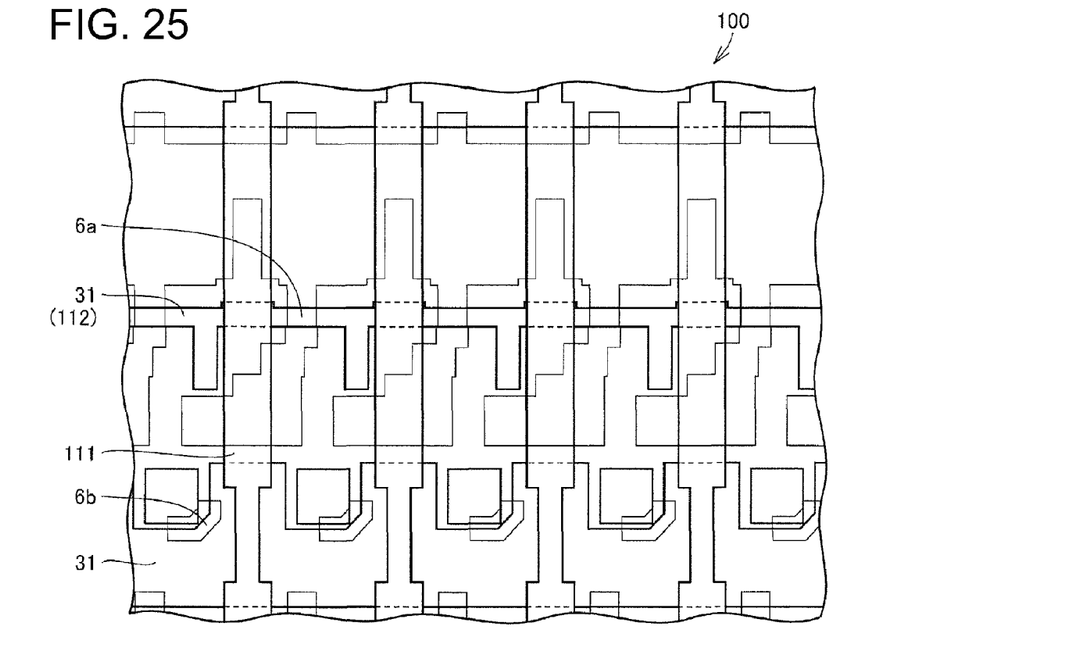
FIG. 25 is a plan view of a display device of Embodiment 2 of the present invention.

A method of manufacturing a display device of Embodiment 2 of the present invention will be explained with reference to FIGS. 25 and 26. FIG. 25 is a plan view of the display device 100 of the present embodiment. In the figure, the overlapping second resist pattern is indicated with narrow lines. As shown in FIG. 25, in the display device 100 of the present embodiment, a plurality of pixel electrodes are driven by thin film transistors, respectively. The display device 100 includes gate wiring lines 112 disposed on a substrate for supplying signals to the thin film transistors, and a plurality of source wiring lines 111 formed above the gate wiring lines 112 so as to intersect with the gate wiring lines 112. The first conductive pattern 31 includes the gate wiring lines 112 and a plurality of conductors that are formed in the same layer as the gate wiring lines 112. The first conductive pattern 31 has shoulder portions 6a and 6b in portions of edges of the upper surface thereof between the source wiring lines. Each of the shoulder portions 6a and 6b is formed by removing a portion of the first conductive pattern 31 from the upper surface through an intermediate point along the direction of thickness.

The shoulder portions 6a and 6b are formed in positions where the openings of the second resist pattern were formed during the manufacturing process. The second resist pattern is not left in the final product, but the shoulder portions indicate that the openings of the second resist pattern were formed therein during the manufacturing process.

Figure 26:
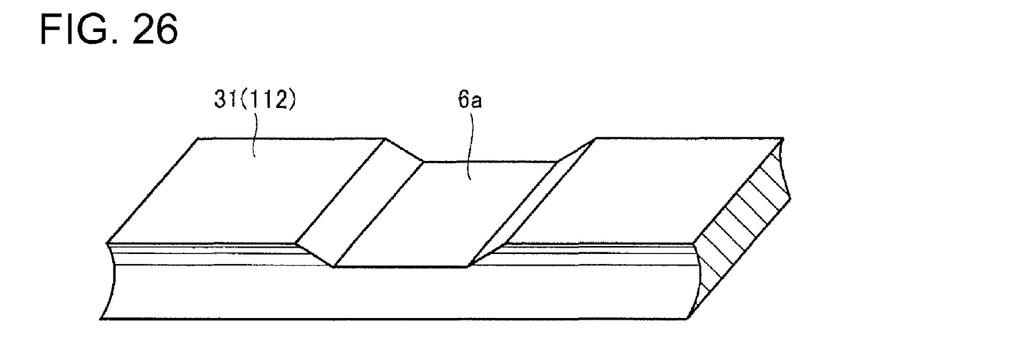
FIG. 26 is a perspective view of an area around a shoulder portion of a first conductive pattern of the display device of Embodiment 2 of the present invention.

FIG. 26 shows a perspective view of an area near the shoulder portion 6a of the first conductive pattern 31. Because the first conductive pattern 31 is a gate wiring line 112 in this example, a selected section of the gate wiring line 112 extended linearly is shown. In FIG. 26, to clearly show a cross sectional shape, a perspective view of the gate wiring line 112 having both edges cut off vertically is shown. In the shoulder portion 6a, the thickness of the first conductive pattern 31 is reduced, and overhangs at the side faces do not exist in the shoulder portion 6a even if overhangs are formed at side faces in other portions than the shoulder portion 6a. The shoulder portion 6b has a similar structure.

According to the display device of the present embodiment, a groove is not formed in the interlayer insulating film in the shoulder portion, and therefore, at least in the shoulder portion, it is possible to more reliably prevent the source metal from being left in an unintended manner. This makes it possible to reduce an occurrence of the leak current between the source wiring lines.

The respective embodiments disclosed above are illustrative in every aspect, and are not limiting. The scope of the present invention is defined by the claims, rather than the above descriptions, and includes all modification having equivalent meaning to the claims and made within the scope of the claims.

INDUSTRIAL APPLICABILITY

The present invention can be used for a display device and a method of manufacturing the same.

DESCRIPTION OF REFERENCE CHARACTERS 4 opening
5a, 5c Ti layer
5b Al layer
6a, 6b shoulder portion
11 first resist pattern 12 second resist pattern
31 first conductive pattern
51 source metal layer
79 substrate
80 gate metal layer
81a, 81b conductive pattern
82a, 82b resist pattern
83 interlayer insulating film
84, 85 portion (corresponding to side wall)
100 display device
101 source driver
102 gate driver
105 controller
110 pixel
111 source wiring line
112 gate wiring line
115 TFT
116 auxiliary capacitance electrode

The invention claimed is:

1. A method of manufacturing a display device of a type in which a plurality of pixel electrodes are driven by thin film transistors, respectively, the display device including gate wiring lines disposed on a substrate to supply signals to the thin film transistors and a plurality of source wiring lines disposed above the gate wiring lines so as to intersect with the gate wiring lines, the method comprising:
    forming a gate metal layer on a surface of the substrate;
    forming a first resist pattern so as to cover a portion of an upper surface of the gate metal layer;
    etching the gate metal layer using the first resist pattern as a mask to form a first conductive pattern that includes the gate wiring lines; and
    forming a second resist pattern partially exposing a portion of an edge of an upper surface of the first conductive pattern between the source wiring lines to be formed and covering other portions of the first conductive pattern, and etching the partially exposed portion of the edge of the upper surface of the first conductive pattern through an intermediate point of the first conductive pattern along a direction of thickness.

2. The method of manufacturing a display device according to claim 1, further comprising conducting an impurity doping process using an impurity doping mask after the step of etching the first conductive pattern through the intermediate point thereof along the direction of thickness,
    wherein the second resist pattern that is used in the step of etching the first conductive pattern through the intermediate point thereof along the direction of thickness is formed by using the impurity doping mask.

3. The method of manufacturing the display device according to claim 1, further comprising:
    forming an interlayer insulating film so as to cover the first conductive pattern;
    forming a source metal layer so as to cover the interlayer insulating film; and
    patterning the source metal layer to form the plurality of source wiring lines.

4. A display device of a type in which a plurality of pixel electrodes are driven by thin film transistors, respectively, the display device comprising:
    a first conductive pattern that includes gate wiring lines disposed on a substrate to supply signals to the thin film transistors, and a plurality of conductors formed in a same layer as the gate wiring lines; and
    a plurality of source wiring lines disposed above the gate wiring lines so as to intersect with the gate wiring lines,
    wherein the first conductive pattern has a shoulder portion where a part thereof from an upper surface through an intermediate point along a direction of thickness is removed, the shoulder portion being located in a portion of an edge of the upper surface of the first conductive pattern between the source wiring lines.

* * * * *